United States Patent [19]

Chikamura et al.

[11] 4,354,104
[45] Oct. 12, 1982

[54] SOLID-STATE IMAGE PICKUP DEVICE

[75] Inventors: Takao Chikamura, Osaka; Shinji Fujiwara, Minoo; Masakazu Fukai, Nishinomiya, all of Japan

[73] Assignee: Matsushita Electric Industrial Co., Ltd., Osaka, Japan

[21] Appl. No.: 147,276

[22] Filed: May 6, 1980

[51] Int. Cl.$^3$ ............................................. H01J 40/14
[52] U.S. Cl. ................................ 250/211 J; 250/578; 357/30; 357/31
[58] Field of Search .................... 250/211 J, 578, 237; 357/30, 31; 358/212, 213

[56] References Cited

U.S. PATENT DOCUMENTS 3,858,233  12/1974  Miyata et al. .................. 357/31 X Primary Examiner—David C. Nelms
Assistant Examiner—Darwin R. Hostetter
Attorney, Agent, or Firm—Burgess, Ryan and Wayne

[57] ABSTRACT

In a solid-state image pickup device of the type in which a photoconductive substance is formed as a photosensor on a scanning device consisting of charge-transfer elements or MOS matrix elements, light shielding means are provided in order to optically shield the boundaries or spacing between first electrodes each of which represents a picture element and which electrically couples between the scanning device and the photosensor, whereby a high resolution can be obtained and concurrently effects of blooming can be remarkably improved.

7 Claims, 10 Drawing Figures

SOLID-STATE IMAGE PICKUP DEVICE

BACKGROUND OF THE INVENTION

The present invention relates to a solid-state image pickup device.

In order to improve the photoelectric sensitivity of the solid-state image pickup devices, there have been devised and demonstrated various improved devices. For instance, Japanese Patent Application Laid-Open No. 49-91116 discloses a solid-state image pickup device in which an X-Y scanning element consisting of field-effect transistors is combined with a photoconductive thin film instead of an array of photodiodes. Another Japanese Patent Application Laid-Open No. 51-95720 discloses a solid-state image pickup device in which a photoconductive thin film is combined with a charge transfer element capable of self-scanning. The characteristics of these photoconductive-layer type solid-state image pickup devices are in general determined upon the characteristics of a photoconductive layer or thin film and its associated scanning element. For instance, the photoelectric sensitivity is dependent upon a material which forms a photoconductive layer. The resolution in these devices is dependent upon the number of picture elements and the transverse leakage current in the photoconductive layer. In order to obtain a high resolution comparable with that of a camera tube, a large number of picture elements must be arrayed at a very high density so that their spacing becomes very narrow. As a result even if, under the dark conditions, a photoconductive layer exhibits a considerably higher degree of resistance so that the integration for one frame period can be able with a lesser degree of transverse leakage current. When a light image falls upon the device, the transverse leakage current will increases with the resultant decrease in resolution. The reason is that the light falls over the whole surface of the photoconductive layer. In addition, the incident light passes between the adjacent first electrodes and reaches a substrate so that the excited carriers in the substrate are diffused into the scanning area in the unit cells with the resultant effects of blooming.

SUMMARY OF THE INVENTION

In view of the above, the present invention has for its primary object to provide a solid-state image pickup device which can suppress the transverse leakage current to a minimum so that a high resolution can be attained and cocurrently the effects of blooming can be suppressed to a minimum degree.

To the above and other ends, briefly stated, the present invention provides a solid-state image pickup device comprising a p- or n-type substrate, at least two or more first electrodes which represent picture elements respectively and which are formed on said substrate and electrically isolated from each other, a photoconductive layer formed on the substrate and the first electrodes thereon, and light shielding means formed on the substrate or the second electrode upon which falls a light image in order to optically shield the boundaries or spacings between the adjacent first electrodes.

The above and other objects, effects, features and advantages of the present invention will become more apparent from the following description of preferred embodiments thereof taken in conjunction with the accompanying drawings.

DESCRIPTION OF THE PREFERRED EMBODIMENTS

Figure 1:
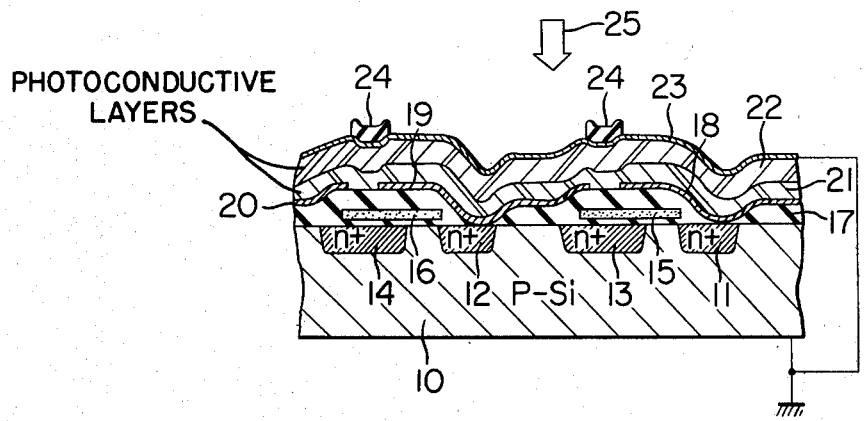
FIG. 1 is a cross sectional view of a first embodiment of a charge-transfer type solid-state image pickup device in accordance with the present invention.

In FIG. 1 is shown in cross section two elements formed on a silicon substrate of a charge transfer type solid image pickup device. First source regions or n+ regions 11 and 12 are formed within the bulk of a p-type semiconductor substrate 10 so that diodes are provided. In the case of the bucket brigade device, it is provided with potential wells consisting of n-type drain regions 13 and 14 of first field-effect transistor, but in the case of the charge-coupled device n-type regions 13 and 14 are not provided. Since the charged-coupled device is of the charge transfer type so that the present invention will be described below in conjunction with the bucket bridge device. Numerals 15 and 16 denote gate electrodes of the first field-effect transistors. An insulating layer 17 is formed so as to electrically isolate the substrate 10, the gate electrodes 15 and 16 and the first electrodes 18, 19 and 20. The first electrode 18 is made into electrical contact with the n+-type region 11 while the first electrode 19 with the n+-type region 12, and the first electrodes 18, 19 and 20 are electrically isolated from each other. A hole blocking layer 21 is formed over the first electrodes 18, 19 and 20 and a photoconducting layer 22 consisting of $(Zn_{1-x}Cd_xTe)_{1-y}(In_2Te_3)_y$ is formed over the hole blocking layer 21. It is to be understood that the photoconducting layer 22 is not limited only to the above-described substance and that any suitable substance such as amorphous silicon or the like can be used. A second electrode 23, which is transparent, is formed on the photoconducting layer 22. Formed over the second electrode 23 and in opposed relationship with the boundaries between the first electrodes 18, 19 and 20 are light shielding layers 24 which are optically black and are the most important feature of the present invention. Incident light is indicated by 25.

Figure 2:
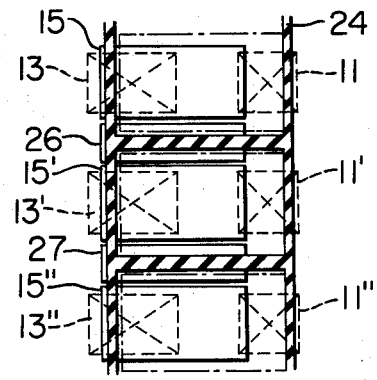
FIG. 2 is a fragmentary top view thereof.

In FIG. 2 is shown in top view of three element. The first field-effect transistor consists of the source or n+-type region 11, the drain or n+-type region 13 and the gate electrode 15. The second field-effect transistor consists of the source or n+-type region 13, a source 13' and a gate electrode 26. The first field-effect transistors have the source regions 11' and 11", the drain regions 13' and 13" and the gate electrodes 15' and 15". 27 is a gate electrode of the second field-effect transistor.

Figure 3:
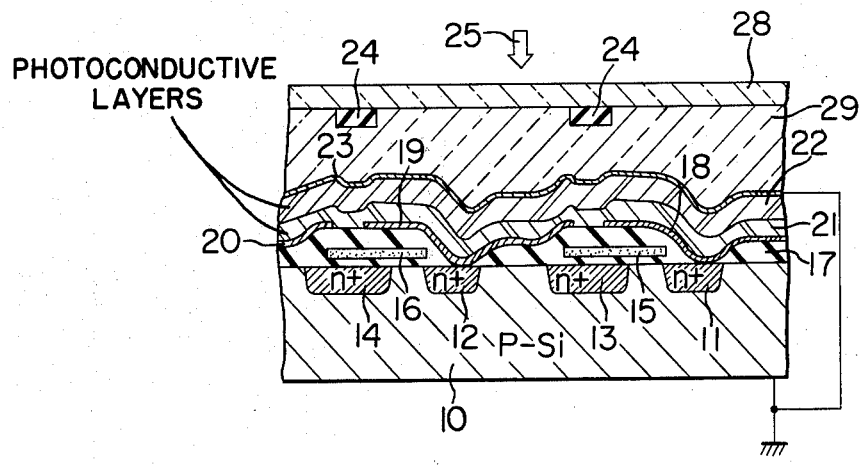
FIGS. 3, 4 and 5 are cross sectional views of second, third and fourth embodiments, respectively, of the present invention.

In a second embodiment shown in FIG. 3, the light shielding layers or optical blacks 24 formed on a glass substrate are formed in the bulk of an optically transparent substance 29.

Figure 4:
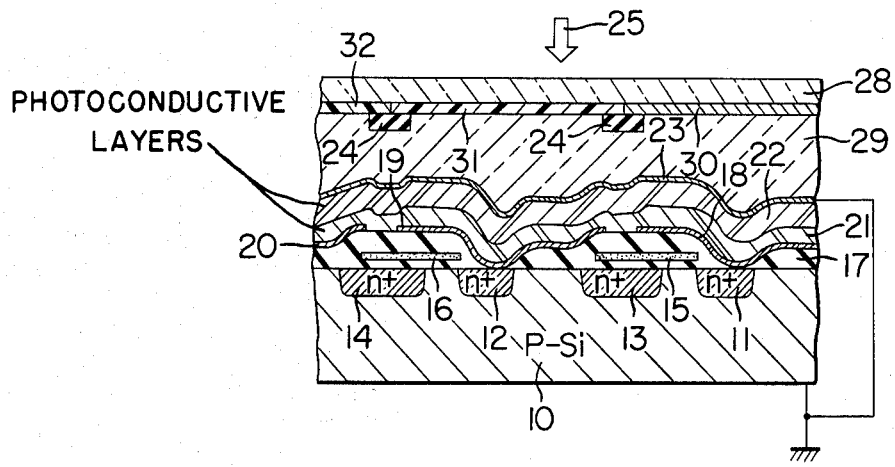

A third embodiment shown in FIG. 4 is substantially similar in construction to the second embodiment just described above except that optical filters 30, 31 and 32 are interposed between the glass substrate 28 and the optically transparent substance 29. Instead of forming the optical blacks 24 just below the color filters 30, 31 and 32, they may be formed in coplanar relationship with the filters or they may be formed between the filters and the glass substrate 28.

Figure 5:
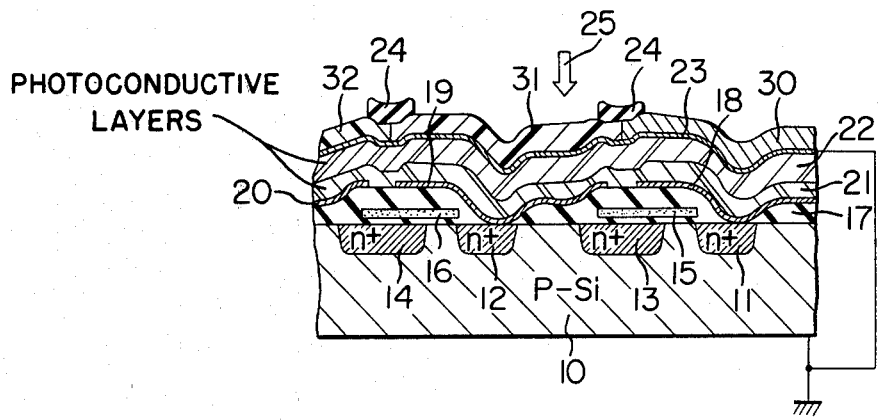

In a fourth embodiment shown in FIG. 5, the optical blacks 24 are formed on the filters 30, 31 and 32 the filters being formed over the second electrode 23.

Figure 6A:
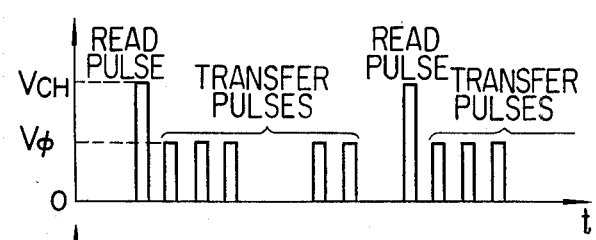
FIGS. 6A and 6B are timing charts used for the explanation of the mode of operation of the first embodiment shown in FIGS. 1 and 2.
Figure 6B:
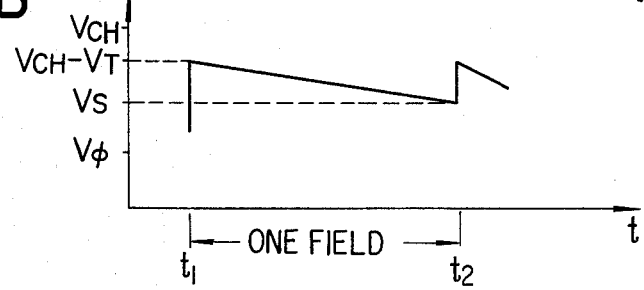

Next referring back to FIGS. 1 and 2, the mode of readout of the optical image or information will be described in further conjunction with FIGS. 6A and 6B showing the drive pulses for driving the element and the variation in potential at the first electrode 18. At $t_1$ the read pulse $V_{CH}$ is applied to the gate electrode 15 so that the potential at the first electrode 18 rises to ($V_{CH}$-$V_T$) as shown in FIG. 6B, where $V_T$ represents the threshold voltage of the first field-effect transistor consisting of the n+-type regions 11 and 13 and the gate electrode 15. When the light 25 is incident on the element, the photoelectric current is produced in the optically conducting layer 22 so that the potential of the first electrode 18 drops to Vs in one field period. This potential drop is in proportion to the intensity of the incident light 25.

At $t_2$ the read pulse $V_{CH}$ is applied again to the gate electrode 15 so that the first electrode 18 rises again to ($V_{CH}$-$V_T$) and the charge in proportion to Vs is transferred into the n+-type region 13 and is further transferred into the region 13′ when the transfer pulse is applied to the gate electrode 26 of the second field-effect transistor. In like manner, when the next transfer pulse is applied to the gate electrode 27, the charge is transferred into the region 13″. In this way the charge is transferred to the output.

Next the steps for fabricating the solid image pickup devices in accordance with the present invention will be described. First the n+-type regions 11, 12, 13 and 14 are formed within the bulk of the silicon substrate 10, which is of p-type, by the diffusion techniques. Next the silicon oxide layer for insulating the gate electrode 15 is grown or otherwise formed by for instance the oxidation process. Thereafter the gate electrode 15 made of polysilicon is formed. Thereafter the insulating layer 17 is formed by applying insulating glass with a low melting point such as phospho-silicate glass and contact windows are opened so as to provide ohmic contact of the first electrode 18, 19 to the n+-type regions 11 and 12 respectively. Thereafter the surface of the insulating layer 17 is heated and softened so that it is smoothened. Next the electrode 18 consisting of Mo, Ta or the like is formed or deposited and etched into a two-dimensional mosaic of elements each corresponding to a picture element as shown in FIG. 1. Thereafter ZnS, ZnSe, CdS and CdSe are deposited as the hole blocking layer 21 by the vacuum evaporation techniques to a thickness of from 0.1 to 1.0 micron meter. In like manner, the photoconducting layer 22 is formed to a thickness of from 0.6 to 2.5 micron meter by the vacuum evaporation process of $(Zn_{1-x}Cd_xTe)_{1-y}(In_2Te_3)_y$. The heterojunction thus obtained is heat-treated in vacuum at 300° to 600° C. for 2 to 30 minutes. Alternatively, the photoconductive layer 22 can be formed by the sputtering process with the polysilicon as a target. In this case, it is preferable that the carrier gas consists of Ar and $H_2$ and that the vacuum is maintained at $10^{-3}$ Torr. The electrical resistance as well as the optical sensitivity of thus obtained amorphous silicon layer are dependent upon the concentration of $H_2$ in the layer. In general, the higher the concentration of $H_2$, the more sensitive to the shorter wavelengths the layer becomes. After the photoconducting layer 22 has been formed, the transparent second electrode 23 is formed to a thickness of from 0.1 to 0.5 micron meters by the sputtering process with $In_2O_3$ or $SnO_2$.

Thereafter the light shielding layers 24 which represent the primary feature of the present invention are formed over the second electrode 23 at the positions corresponding to or in opposed relationship with the boundaries between the first electrodes 18, 19 and 20. Any substance capable of preventing the transmission of the incident light 25 into the photoconducting layer 22 can be used. They are for instance carbon which absorbs the incident light 25 or metal such as Cr, Ti, Mo or W which reflects back the incident light 25.

There are available various techniques for forming such light shielding layers 24. For instance, a carbon or metal thin film is formed over the whole surface of the second electrode 23 and etched by the plasma etching process or with a suitable etchant so as to leave only a desired pattern of light shielding layers or the like 24.

Another method is to form a desired pattern of light shielding layers or the like 24 on the glass substrate 28 as shown in FIG. 3 and this substrate 28 is bonded with a suitable optically transparent adhesive in such a way that the light shielding layers or the like 24 are correctly aligned with the boundaries between the first electrodes 18, 19 and 20.

In either cases, the distance between the light shielding layers or the like 24 and the photoconductive layer 22; that is, the thickness of the optically transparent adhesive 29 must be made as small as possible. In practice, the satisfactory effects can be attained with the thickness of less than about 20 micron meters.

In the case of the third embodiment shown in FIG. 4, a gelatine film is formed over the whole surface of the glass substrate 28 and the elementary areas each corresponding to a picture element are colored or dyed with blue, green and red pigments, whereby the optical color filters 30, 31 and 32 are provided. A desired pattern of light shielding layers or the like 24 is then formed over the optical color filters 30, 31 and 32. The glass substrate 28 with the optical color filters 30, 31 and 32 and the pattern of light shielding layers or the like 24 is then bonded with an optically transparent adhesive 29 to the solid-state device.

In like manner the optical color filters 30, 31 and 32 are formed over the surface of the second electrode 23 and the light shielding layers or the like 24 are formed in a manner substantially similar to those described above.

In either cases, instead of the organic color filters, any suitable optical color filters made of inorganic substance can be used.

Figure 7:
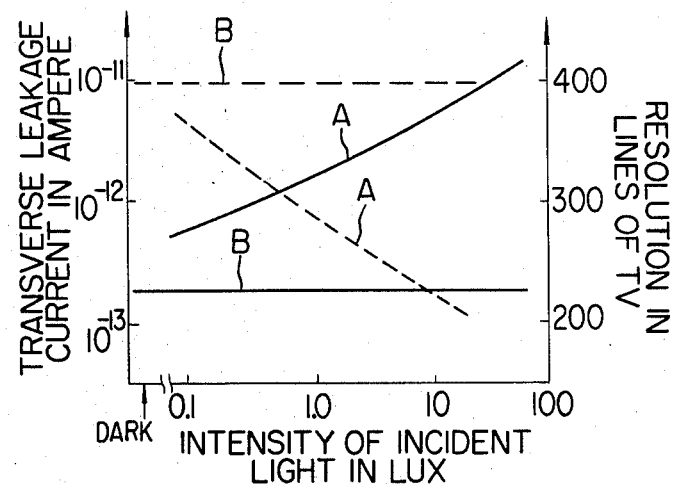
FIG. 7 shows the relationship between the intensity of incident light on the one hand and the transverse leakage current and the resolution on the other hand.

Next the function of the light shielding layers or the like 24 which are the primary feature of the present invention will be described with reference to FIG. 7 showing the relationship between the transverse leakage current (solid lines) in ampere and the resolution (broken lines) on the one hand and the intensity of the incident light in lux on the other hand when there is no light shielding layer or the like (the curves being indicated by A) and when there are provided the light shielding layers 24 (the curves being indicated by B). The transverse leakage current was measured between the two electrodes whose length were 30 micron meters and whose gap was 4 micron meters. The resolution was measured when the elements shown in FIGS. 1 and 2 are arranged into an array of 480 bits.

It is seen that when no light shielding layer or the like is provided, the higher the intensity of the incident light, the larger the transverse leakage current becomes and the lower the resolution becomes. On the other hand when the light shielding layers or the like 24 are provided in accordance with the present invention, both the transverse leakage current and the resolution remain unchanged even when the intensity of the incident light increases.

In Table I below, the resolutions are compared under the standard image pickup conditions in which the intensity of the incident light varies between a few luxes and tens luxes when the light shielding layers or the like are provided and when none of them is provided.

TABLE I

|  | with light shielding layers or the like | without light shielding layers or the like |
| --- | --- | --- |
| resolution TV lines | 400 | 250 |

The provision of the light shielding layers or the like 24 also serves to reduce blooming phenomenon. In the case of the prior art solid-state image pickup devices without light shielding layers or the like 24, the incident light 25 passes between the first electrodes 18 and 19 and reaches the substrate 10. As a result, the carriers are excited in the substrate 10 and diffused into the charge transfer elements so that blooming is caused.

Figure 8:
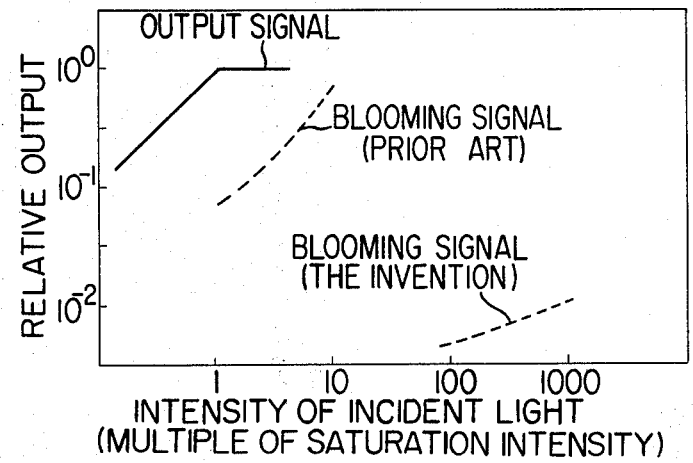
FIG. 8 shows the relationship between the intensity of the incident light and the resulting blooming signal in order to demonstrate the effects of light shielding means of the present invention.

In order to compare the solid-state image pickup devices of the present invention and of the prior art, the blooming signals were measured at the lower area of the TV raster when the spot light of 10% was incident upon the center of the raster. The results are shown in FIG. 8. It is seen that the capability of suppressing the blooming by the provision of the light shielding layers or the like in accordance with the present invention is about 1000 times as high as that of the prior art solid-state image pickup device.

In summary the provision of the light shielding layers or the like 24 can considerably improve the resolution while remarkably suppressing blooming.

Next the necessary conditions to derive the advantages attained by the provision of the light shielding layers or the like will be described. In order to focus a subject on the image pickup plate, an optical lens system is used. When the aperture of the lens system is increased, the light rays incident at inclined angles to the axis of the lens system are increased. Therefore it is preferable that the distance between the light shielding layers or the like 24 and the transparent second electrode 23 be as small as possible as shown in FIG. 1.

The construction of the second embodiment shown in FIG. 3 can facilitate the fabrication with a high yield because the light shielding pattern and the image pickup plate can be fabricated separately.

With the image pickup plates with the color filters as shown in FIGS. 4 and 5, there can be provided a color television camera which is compact in size and light in weight and highly reliable in operation. As described above, when the aperture of the lens system is widely opened, the fourth embodiment shown in FIG. 5 is preferable because the distance between the light shielding layers or the like 24 and the second electrode 23 is small. For the sake of the simplification of the production processes and in order to attain a high yield, the third embodiment shown in FIG. 4 is adapted because the glass substrate with the light shielding layers or the like 24 and the optical color filters 30, 31 and 32 and the image pickup plate 10 can be fabricated separately.

So far the present invention has been described in conjunction with the charge-transfer elements formed on the semiconductor substrate, but it is to be understood that the present invention is not limited to that and can be equally applied to an X-Y matrix type device so that a high resolution can be attained while blooming phenomena can be remarkably suppressed.

Figure 9:
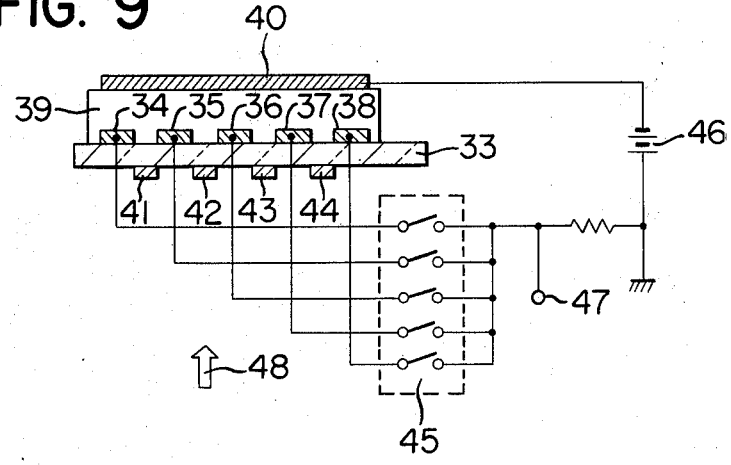
FIG. 9 is a cross sectional view of a fifth embodiment of the present invention, its substrate being transparent.

In FIG. 9 is shown a fifth embodiment of the present invention which is a linear sensor. First electrodes 34 through 38 each corresponding to a picture element are formed on a transparent substrate 33 and a photoconductive layer 39 is formed over the first electrodes 34 through 38. A second electrode is formed over the photoconductive layer 39. Light shielding layers or the like 41 through 44 are formed on the opposite major surface of the transparent substrate 33 at positions each corresponding to the gap between the adjacent first electrodes 34 through 38. In order to sequentially scan the first electrodes 34 through 38, they are connected to a bank of switches 45 which is in turn connected to a shift register. A voltage is applied across the photoconduction layer 39 from a power supply 46. The output is derived from an output terminal 47. The incident light is indicated by 48.

The linear sensor of the type described can be used in, for example, a facsimile. The signals each representative of the intensity of the light 48 incident on each picture element or first electrode are sequentially read out by sequentially operating the switches 45 and derived from the output terminal 47.

When a large number of unit cells are arrayed in a straight line with a higher degree of density, the photoelectric current flows between the adjacent first electrodes 34 through 38 with the resultant drop in resolution. However, according to the present invention, the light shielding layers or the like 41 through 44 are formed on the surface of the transparent substrate on which falls the incident light 48 so that the adverse effects due to the transverse leakage current can be eliminated.

In summary, the present invention provides a solid-state image pickup device in which a pattern of light shielding layers or the like 24 or 41 through 44 is provided so as to shield optically the boundaries or spacings between the adjacent first electrodes so that a high resolution can be attained and simultaneously blooming phenomenon can be suppressed considerably. Thus the solid-state image pickup devices of the present invention are used for a host of applications, including TV cameras, facsimiles and so on which must be compact in size and light in weight and have a high resolution.

What is claimed is:

1. A solid-state image pickup device characterized by the provision of
(a) a substrate, (b) at least two or more first electrodes of unit cells which are formed on said substrate and electrically isolated from each other, (c) a photoconductive layer formed over said substrate and over said first electrodes, (d) a second electrode formed over said photoconductive layer, and (e) light shielding means formed above said substrate upon which falls the incident light.

2. A solid-state image pickup device as set forth in claim 1 or 6 further characterized in that said substrate is of a p- or n-type, an n- or p-type region formed in the bulk of said p- or n-type substrate, a charge-transfer element or X-Y switch for transferring the charge signal formed in the bulk of said p- or n-type substrate and physically isolated from said n- or p-type region, a gate electrode for reading out the packet of charge from said n- or p-type region into said charge-transfer element or X-Y switching element, an insulating layer formed over said p- or n-type substrate and said gate electrode, said insulating layer having a contact window for contact with said n- or p-region, and said first electrode is electrically connected to said n- or p-type region.

3. A solid-state image pickup device as set forth in claim 2 further characterized in that said light shielding means are formed or mounted on said second electrode.

4. A solid-state image pickup device as set forth in claim 2 further characterized in that said light shielding means are formed or mounted on said second electrode with a transparent substance interposed therebetween.

5. A solid-state image pickup device as set forth in claim 2 further characterized in that said light shielding means are formed or mounted on said second electrode with optical color filters interposed therebetween.

6. A solid-state image pickup device characterized by the provision of (a) a substrate, (b) at least two or more first electrodes of unit cells which are formed on said substrate and electrically isolated from each other, (c) a photoconductive layer formed over said substrate and over said first electrodes, (d) a second electrode formed over said photoconductive layer, and (e) light shielding means formed above said second electrode upon which falls the incident light.

7. A solid-state image pickup device according to claim 1 or 6, wherein said substrate includes an array of field effect transistors having gate electrodes, said light shielding means comprising a grid the opaque portions of which are in alignment with the regions between adjacent gate electrodes.

* * * * *